(12) United States Patent
Wang et al.

(10) Patent No.: US 10,312,617 B2
(45) Date of Patent: Jun. 4, 2019

(54) ELECTRICAL CONNECTOR INCLUDING A METAL HOUSING AND A FLEXIBLE FLAT TRANSMISSION COMPONENT

(71) Applicant: P-TWO INDUSTRIES INC., Taoyuan (TW)

(72) Inventors: Chien-Chun Wang, Taoyuan (TW); Wen-Lun Wang, Taoyuan (TW)

(73) Assignee: P-TWO INDUSTRIES INC., Taoyuan (TW)

(*) Notice: Subject to any disclaimer, the term of this patent is extended or adjusted under 35 U.S.C. 154(b) by 0 days.

(21) Appl. No.: 15/860,665

(22) Filed: Jan. 3, 2018

(65) Prior Publication Data
US 2019/0036253 A1 Jan. 31, 2019

(30) Foreign Application Priority Data

Jul. 26, 2017 (CN) ............ 2017 2 0916132 U

(51) Int. Cl.
*H01R 13/627* (2006.01)
*H01R 12/77* (2011.01)
*H01R 24/60* (2011.01)
H01R 107/00 (2006.01)
H01R 12/59 (2011.01)
H01R 12/61 (2011.01)

(52) U.S. Cl.
CPC ......... *H01R 12/77* (2013.01); *H01R 13/6275* (2013.01); *H01R 24/60* (2013.01); *H01R 12/59* (2013.01); *H01R 12/61* (2013.01); *H01R 12/771* (2013.01); *H01R 12/775* (2013.01); *H01R 13/6271* (2013.01); *H01R 13/6272* (2013.01); *H01R 2107/00* (2013.01)

(58) Field of Classification Search
CPC ............ H01R 13/6275; H01R 13/6582; H01R 13/6271; H01R 13/6272; H01R 12/59; H01R 12/77; H01R 12/771; H01R 12/61; H01R 12/775
USPC ............ 439/353, 357, 358, 492–499, 67, 77
See application file for complete search history.

(56) References Cited

U.S. PATENT DOCUMENTS

| 2007/0099483 A1* | 5/2007 | Tsai | H01R 12/592 439/492 |
| 2009/0023324 A1* | 1/2009 | Koike | H01R 12/79 439/345 |
| 2010/0087087 A1* | 4/2010 | Yeh | H01R 4/023 439/493 |

* cited by examiner

*Primary Examiner* — Abdullah A Riyami
*Assistant Examiner* — Justin M Kratt
(74) *Attorney, Agent, or Firm* — Winston Hsu

(57) ABSTRACT

An electrical connector includes a first metal housing and a flexible flat transmission component. The first metal housing includes an installation portion. The flexible flat transmission component is disposed on the installation portion of the first metal housing, the flexible flat transmission component includes a plurality of contacts, and a first inclined surface is formed on a front end of each contact and opposite to the installation portion.

22 Claims, 6 Drawing Sheets

ELECTRICAL CONNECTOR INCLUDING A METAL HOUSING AND A FLEXIBLE FLAT TRANSMISSION COMPONENT

BACKGROUND OF THE INVENTION

1. Field of the Invention

The present invention relates to an electrical connector, and more particularly, to an electrical connector capable of effectively preventing contacts of metal conducting wires from being easily peeled and reversely bent.

2. Description of the Prior Art

Due to high signal flow between a liquid crystal display and a system host, a low voltage differential signal (LVDS) receiver with an ultra-high speed of 1.4 Gb/s, low power consumption and low electromagnetic radiation is used in a current high-frequency signal transmission system installed between a liquid crystal display interface and a system host board interface, as the signal transmission interface for the liquid crystal display interface. A signal connection is established between the receiver and the signal transmission interface on the system host board interface, i.e. the connector socket on the system host board interface, through the connection of a signal transmission line, and a conventional LVDS signal transmission system is thus composed.

Generally, a male connector of the conventional LVDS signal transmission system includes an upper iron shell, an insulating main body, a conductive terminal, a flexible flat cable and a lower iron shell. The insulating main body is installed on the lower iron shell first, the conductive terminal is inserted into the insulating main body, the conductive terminal is connected to the flexible flat cable, and the upper iron shell is installed on the insulating main body at last. Therefore, this conventional connector has complicated structure, complicated assembly and high manufacturing cost. Besides, this conventional connector also has a large size, which cannot meet slim and light design trends of electronic products.

Therefore, there is a development of utilization of a flexible flat cable to replace with the conductive terminal of the conventional male connector, that is, the conductive terminal is replaced by gold finger contacts of the flexible flat cable. However, the gold finger contacts are usually glued onto a lower insulating layer, and front end surfaces of the gold finger contacts are substantially formed as vertical surfaces. Therefore, the gold finger contacts are easily peeled and reversely bent on the lower insulating layer due to impact of an abutting force of a conducting terminal of a docking connector as docking with the docking connector, which results in damage of the conventional flexible flat cable and leads to customer complaints.

SUMMARY OF THE INVENTION

Therefore, an objective of the present invention is to provide an electrical connector capable of reducing impact of an abutting force of a conducting terminal of a docking connector, for solving the aforementioned problems that front contacts of a conventional flexible flat cable are easily peeled and reversely bent on a lower insulating layer, which results in damage of the conventional flexible flat cable and leads to customer complaints.

In order to achieve the aforementioned objective, an electrical connector includes a first metal housing and a flexible flat transmission component. The first metal housing includes an installation portion. The flexible flat transmission component is disposed on the installation portion of the first metal housing, the flexible flat transmission component includes a plurality of contacts, and a first inclined surface is formed on a front end of each contact and opposite to the installation portion.

The electrical connector of the present invention utilizes the beveled surface disposed on the front end of each contact to reduce the impact of the abutting force of the conducting terminal of the docking connector as docking with the docking connector. It can effectively prevents the contacts of the flexible flat transmission component from being easily peeled and reversely bent, so as to solve a conventional problem that front contacts of a conventional flexible flat cable of a male connector are easily peeled and reversely bent, which results in damage of the conventional flexible flat cable and leads to customer complaints.

These and other objectives of the present invention will no doubt become obvious to those of ordinary skill in the art after reading the following detailed description of the preferred embodiment that is illustrated in the various figures and drawings.

DETAILED DESCRIPTION

In order to illustrate technical specifications and structural features as well as achieved purposes and effects of the present invention, relevant embodiments and figures are described as follows.

Figure 1:
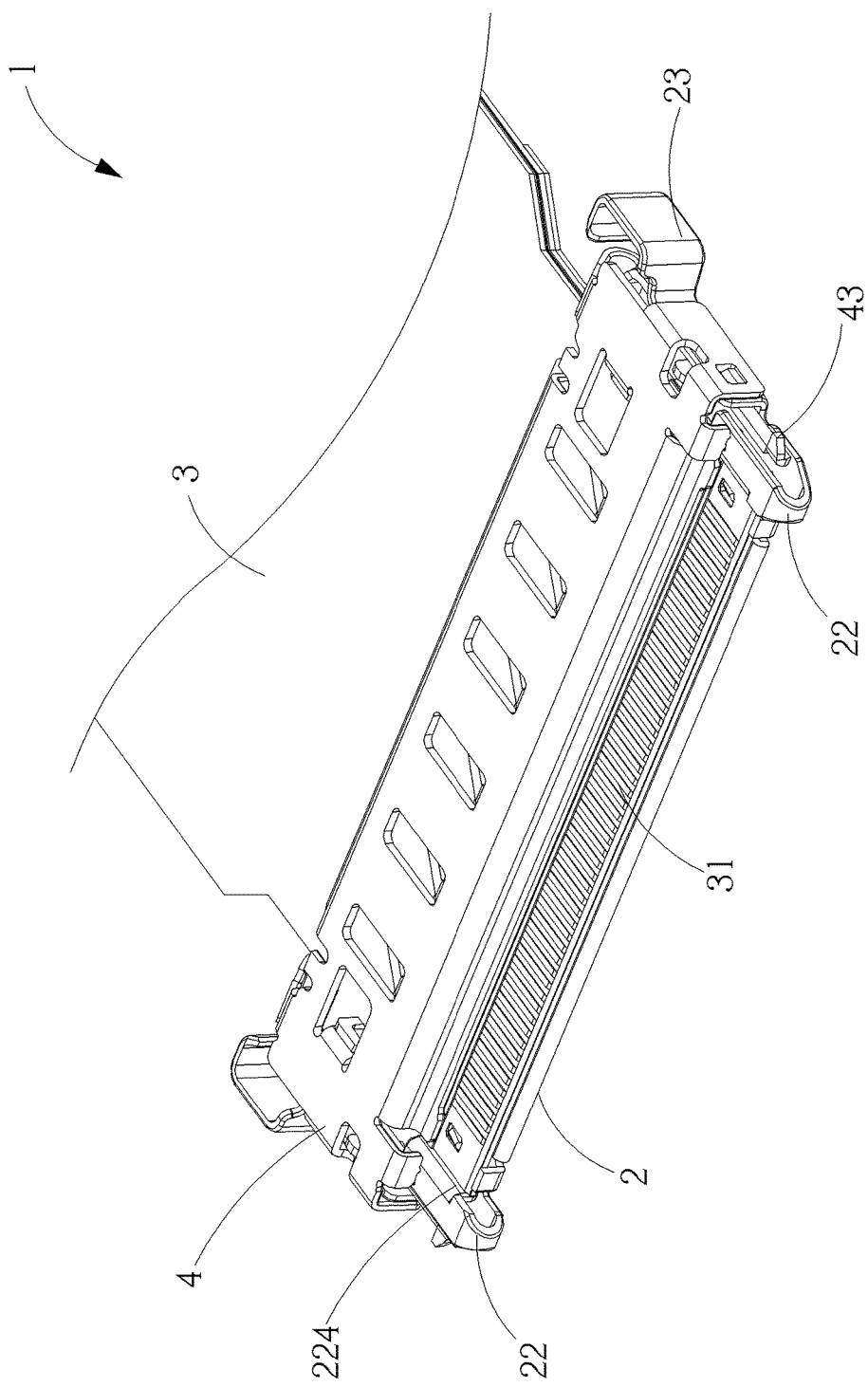
FIG. 1 is a schematic diagram of an electrical connector according to an embodiment of the present invention.
Figure 2:
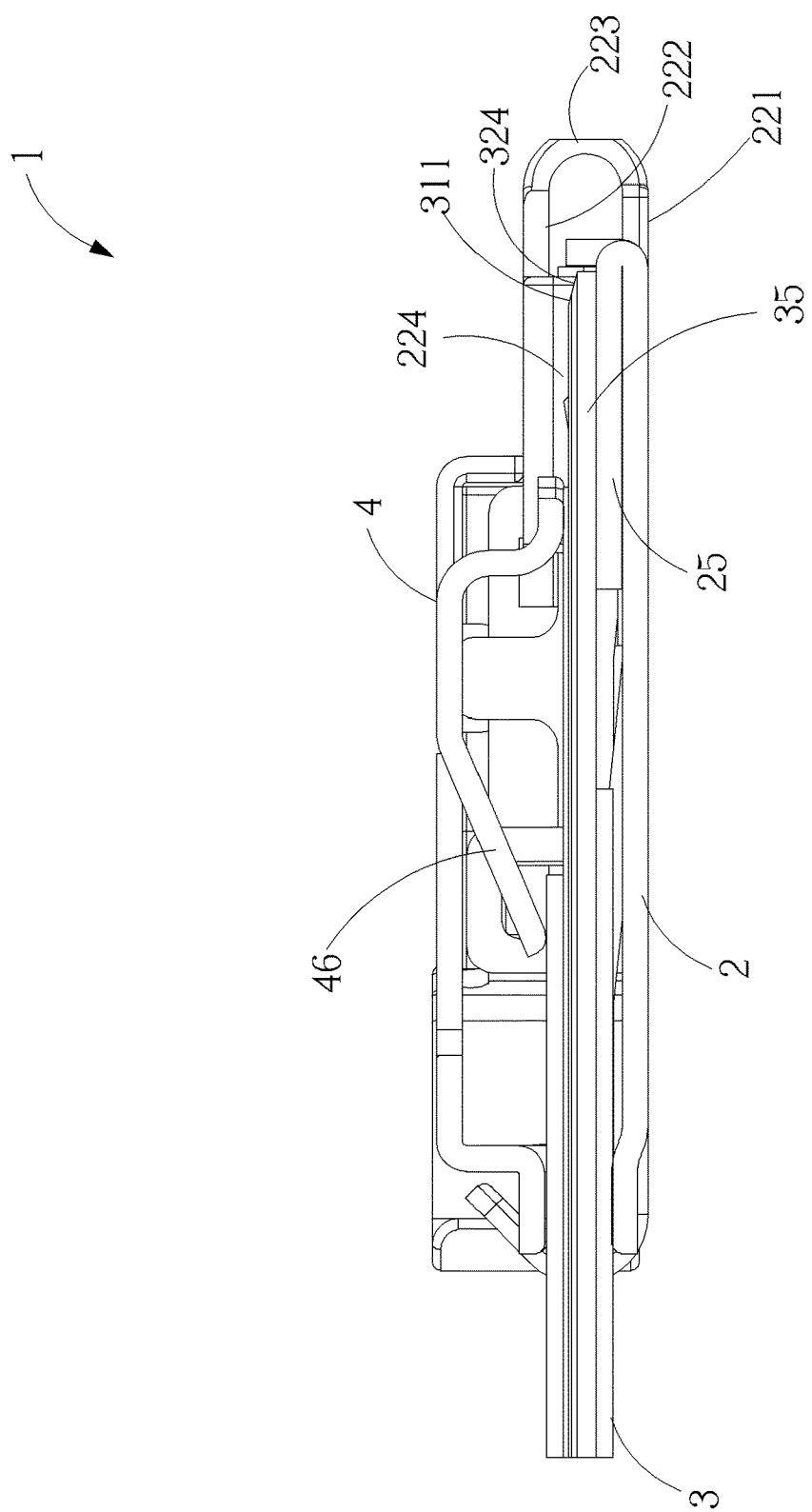
FIG. 2 is a sectional diagram of the electrical connector as shown in FIG. 1 according to the embodiment of the present invention.
Figure 3:
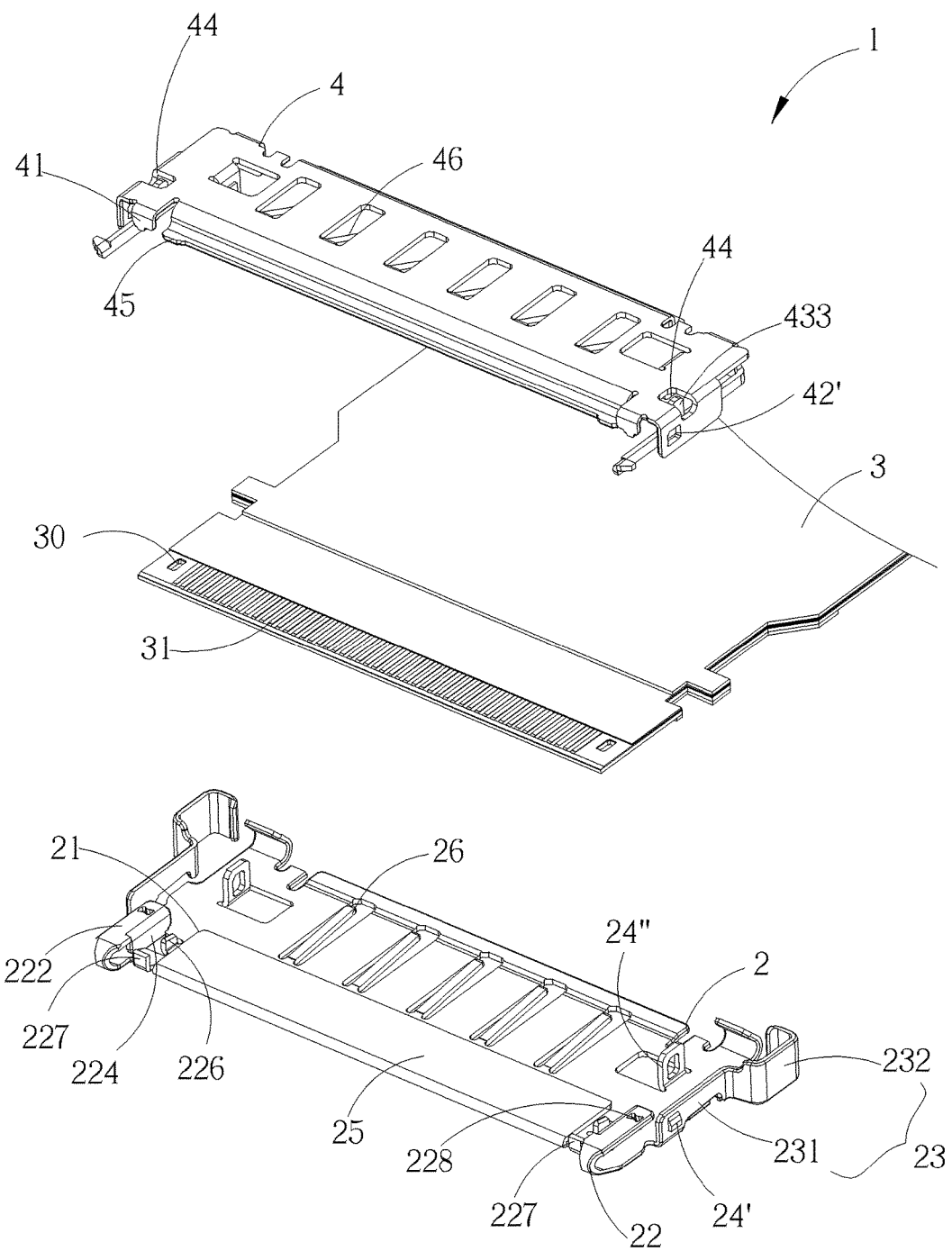
FIG. 3 is an exploded diagram of the electrical connector as shown in FIG. 1 according to the embodiment of the present invention.
Figure 4:
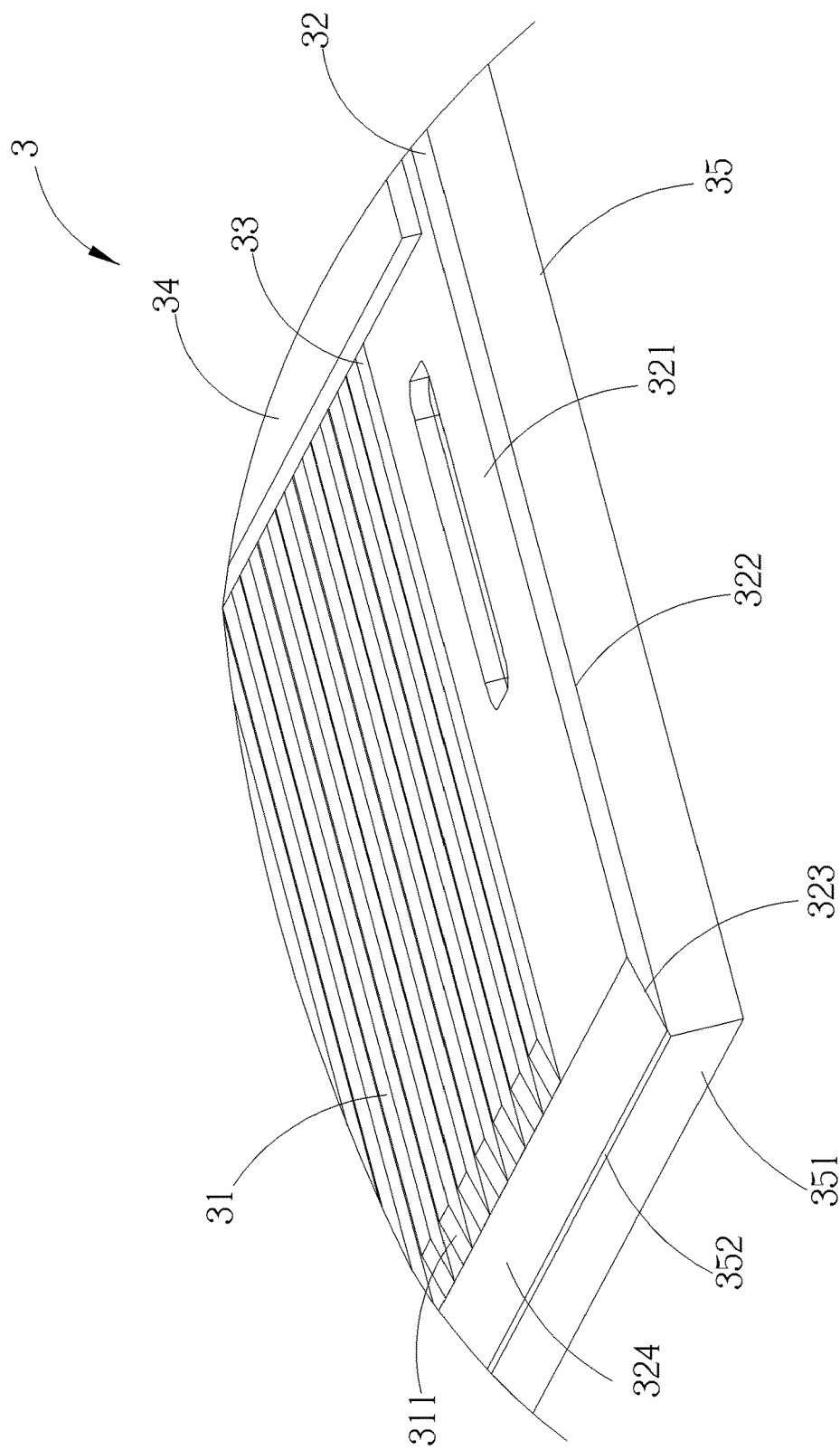
FIG. 4 is a partial enlarged diagram of a flexible flat transmission component as shown in FIG. 3 according to the embodiment of the present invention.
Figure 5:
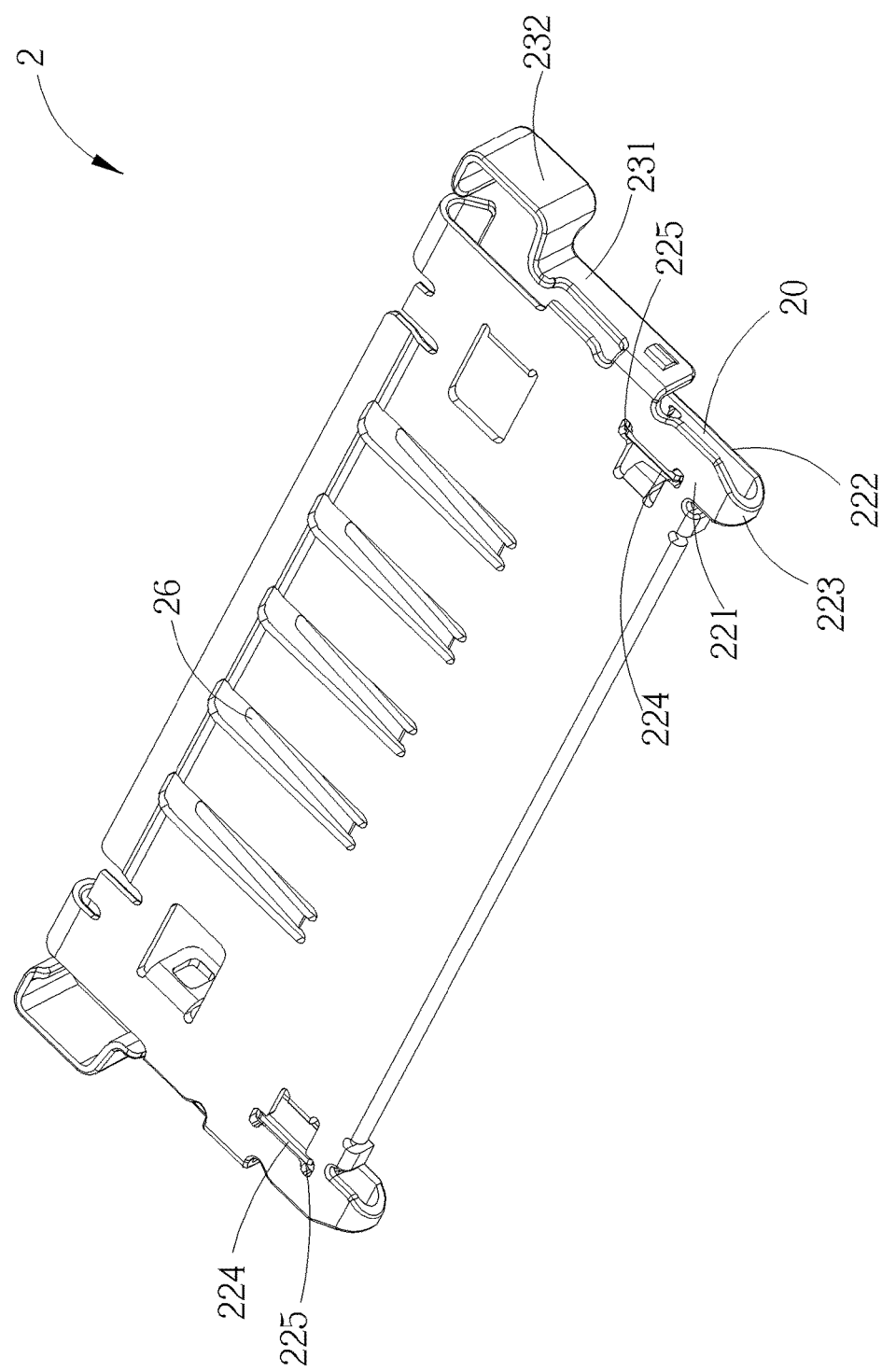
FIG. 5 is a schematic diagram of a first metal housing as shown in FIG. 3 in another view according to the embodiment of the present invention.
Figure 6:
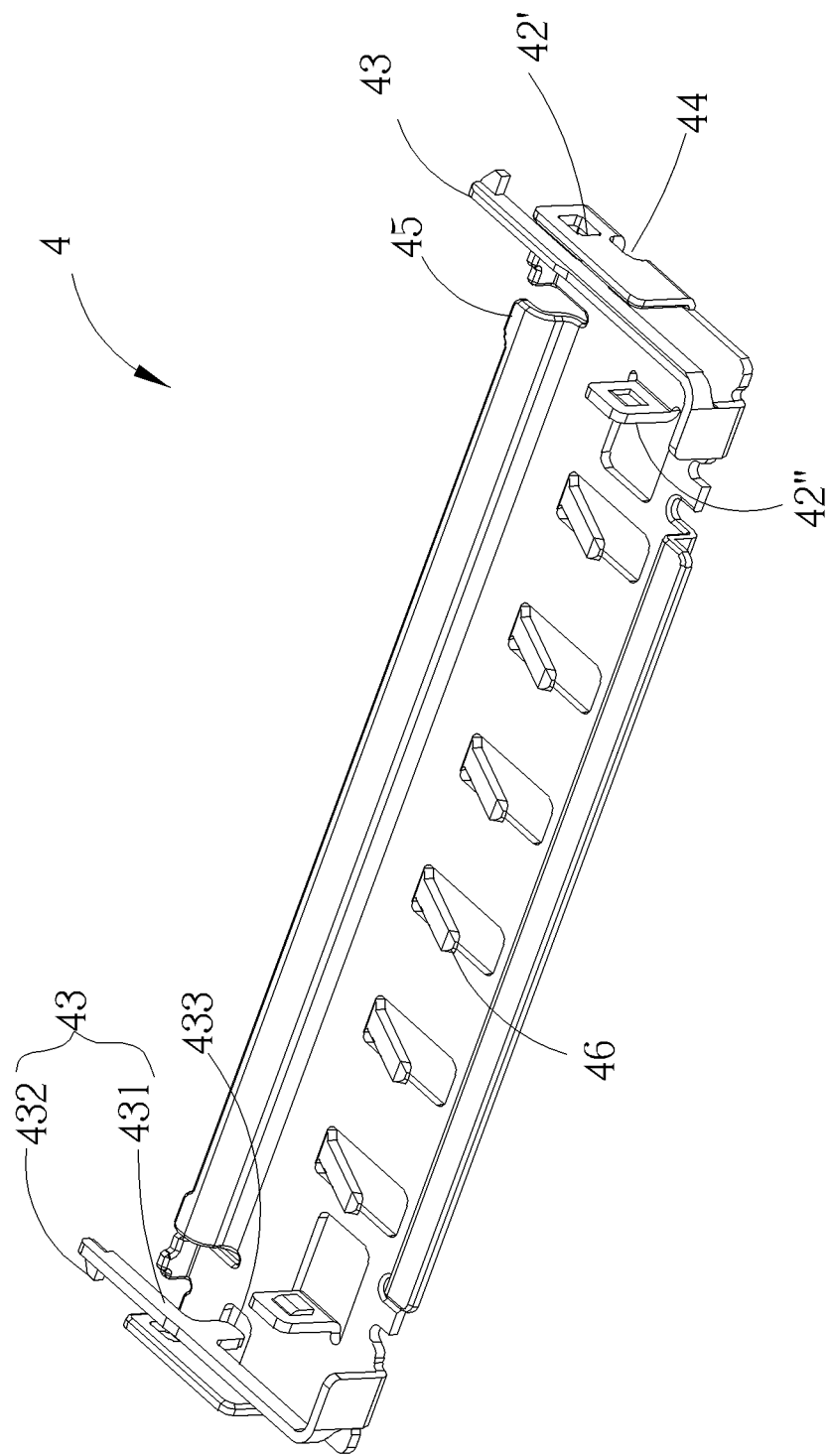
FIG. 6 is a schematic diagram of a second metal housing as shown in FIG. 3 in another view according to the embodiment of the present invention.

Please refer to FIG. 1 to FIG. 6. FIG. 1 is a schematic diagram of an electrical connector 1 according to an embodiment of the present invention. FIG. 2 is a sectional diagram of the electrical connector 1 as shown in FIG. 1 according to the embodiment of the present invention. FIG. 3 is an exploded diagram of the electrical connector 1 as shown in FIG. 1 according to the embodiment of the present invention. FIG. 4 is a partial enlarged diagram of a flexible flat transmission component 3 as shown in FIG. 3 according to the embodiment of the present invention. FIG. 5 is a schematic diagram of a first metal housing 2 as shown in FIG. 3 in another view according to the embodiment of the present invention. FIG. 6 is a schematic diagram of a second metal housing 4 as shown in FIG. 3 in another view according to the embodiment of the present invention. The electrical connector 1 includes the first metal housing 2, the flexible flat transmission component 3 and the second metal housing 4. The flexible flat transmission component 3 is clamped between the first metal housing 2 and the second metal housing 4.

The first metal housing 2 includes an installation portion 21 and two guiding portions 22 disposed on two sides of the installation portion 21. Each guiding portion 22 includes a bottom section 221, a top section 222 opposite to the bottom section 221, and a bending section 223 connected to the bottom section 221 and the top section 222. An extending section 224 extends from the top section 222. A slot 225 is formed on the bottom section 221, and the extending section 224 extends from the top section 222 and toward the bottom section 221 to engage inside the slot 225. Understandably, in this embodiment, the bottom section 221, the top section 222, the bending section 223 and the extending section 224 can be integrally formed on the first metal housing 2, so as to provide a stable guiding structure. Besides, an accommodating space 20 is formed among the top section 222, the extending section 224 and the bottom section 221.

In this embodiment, the installation portion 21 includes two protruding parts 226 at two sides. The installation portion 21 further includes two blocking parts 227 at a front edge and located in positions corresponding to the two protruding parts 226. Two releasing portions 23 are disposed on the first metal housing 2 and extend from the bottom sections 221 of the guiding portions 22 upwards and rearwards, respectively. Each releasing portion 23 includes a forcing arm 231 and a pressing part 232 disposed on a distal end of the forcing arm 231. The first metal housing 2 further includes first engaging portions 24' and 24", which can be different types, disposed on a front end of the forcing arm 231 and the installation portion 21, for fastening with the second metal housing 4. Understandably, for enhancing connection strength and increasing thickness of connection, a folding portion 25 is disposed on the installation portion 21, and the folding portion 25 can be a structure provided with a forwardly extending edge of the installation portion 21 of the first metal housing 2 extending upwardly and backwardly. Besides, a plurality of grounding clips 26 are formed on the first metal housing 2.

The flexible flat transmission component 3 is positioned on the installation portion 21 and the folding portion 25 of the first metal housing 2. The flexible flat transmission component 3 includes a plurality of contacts 31, and the plurality of contacts 31 of the flexible flat transmission component 3 are positioned on the folding part 25, so as to enhance structural thickness and strength of connection. In this embodiment, the flexible flat transmission component 3 can be a flexible flat cable (FFC) or a flexible printed circuit (FPC) board, but is not limited thereto. At least one opening 30 is formed on the flexible flat transmission component 3. For example, two openings 30 can be formed on the flexible flat transmission component 3, and the two protruding parts engage with the two openings 30 respectively, so as to locate the flexible flat transmission component 3. Besides, a front edge of the flexible flat transmission component 3 is located nearby and blocked by the two blocking parts 227, so that the two blocking parts 227 can prevent the front edge of the flexible flat transmission component 3 from moving forwardly, so as to locate the flexible flat transmission component 3. Meanwhile, two lateral sides of the flexible flat transmission component 3 are restrained between the two extending sections 224 of the two guiding portions 22 disposed on the two sides of the installation portion 21, so as to restrain the flexible flat transmission component 3 laterally.

It should be noticed that a first inclined surface 311 is formed on a front end of each contact 31 and opposite to the installation portion 21. As shown in FIG. 4, the flexible flat transmission component 3 includes a lower insulating layer 32, a plurality of metal conducting wires 33 arranged in parallel and an upper insulating layer 34. The lower insulating layer 32 includes a top surface 321, a bottom surface 322 opposite to the top surface 321, and a front end surface 323 connected to the top surface 321 and the bottom surface 322. The plurality of metal conducting wires 33 are disposed on the top surface 321 of the lower insulating layer 32. The upper insulating layer 34 partially covers the plurality of metal conducting wires 33, and front ends of the plurality of metal conducting wires 33 stretch out of the upper insulating layer 34 to form the plurality of contacts 31. The first inclined surface 311 formed on the front end of each contact 31 is inclined towards the upper insulating layer 34 and opposite to the installation portion 21, so as to prevent the plurality of contacts 31 from being easily peeled and reversely bent on the lower insulating layer 32 due to impact of an abutting force of a conducting terminal of a docking connector as docking with the docking connector (not shown in figures), for solving a conventional problem that gold finger contacts of a conventional flexible flat cable are easily peeled and reversely bent, which results in damage of the conventional flexible flat cable and leads to customer complaints.

Understandably, for reducing the impact of the abutting force of the conducting terminal of the docking connector as docking with the docking connector, the front end surface 323 of the lower insulating layer 32 includes a second inclined surface 324, and the second inclined surface 324 and the first inclined surface 311 cooperatively form a beveled surface with an uniform slope and opposite to the installation portion 21. The structural design of the second inclined surface 324 can provide the inventive effect of reducing the impact as docking with the docking connector. Besides, a side of the reinforced plate 35 is disposed on the bottom surface 322 of the lower insulating layer 32, so that the plurality of contacts 31 and the reinforced plate 35 are disposed on a top side and a bottom side of the lower insulating layer 32 respectively. The reinforced plate 35 includes a board end surface 351 having a third inclined surface 352. The third inclined surface 352, the second inclined surface 324 and the first inclined surface 311 cooperatively form the beveled surface opposite to the installation portion 2l. Similarly, the structural design of the third inclined surface 352 also can provide the inventive effect of reducing the impact as docking with the docking connector. Understandably, the beveled surface can be formed by cutting a front edge of the flexible flat cable. Preferably, an area of the first inclined surface 311 can be less than an area of the second inclined surface 324, and an area of the third inclined surface 352 can be less than the area of the second inclined surface 324, so as to provide the largest area of the second inclined surface 324 to achieve a better effect of reducing the impact as docking with the docking connector.

The second metal housing 4 is assembled with the first metal housing 2, and the second metal housing 4 covers the flexible flat transmission component 3. The plurality of contacts 31 of the flexible flat transmission component 3 expose out of the second metal housing 4, so as to electrically connect with the docking connector (not shown in figures). In this embodiment, at least one inserting hole 228 is formed on the top section 222, and the second metal housing 4 includes at least one inserting portion 41 for inserting into the at least one inserting hole 228, so as to position the first metal housing 2 and the second metal housing 4. The second metal housing 4 further includes second engaging portions 42' and 42" for engaging with the first engaging portions 24' and 24" of the first metal housing 2, so as to assemble the second metal housing 4 with the first metal housing 2.

In this embodiment, two locking portions 43 and two openings are disposed on two sides of the second metal housing 4, respectively. Each locking portion 43 includes a resilient arm 431 and a hook 432 disposed on a distal end of the resilient arm 431, and a stopping part 433 is disposed on the resilient arm 431 and extends towards the corresponding opening 44, so as to limit a movement range of the stopping part 433 within the opening 44. When a user presses the pressing part 232, the pressing part 232 can drive the forcing arm 231 to contact and force the resilient arm 431, so as to separate the hook 432 from the docking connector. The structural design of the stopping part 433 can prevent over-deformation of the resilient arm 431.

It should be noticed that, in this embodiment, the plurality of contacts 31 of the flexible flat transmission component 3 are positioned on the folding part 25 without protection by any conventional insulating main body. Thus, there is a need of the disposal of the first inclined surface 311 for preventing the plurality of contacts 31 from being peeled. Besides, the locking portion 43 is disposed on the second metal housing 4, the releasing portion 23 is disposed on the first metal housing 2, but is not limited thereto. For example, the locking portions 43 can be disposed on the first metal housing 2, and the releasing portion 23 can disposed on the second metal housing 4, that is, the locking portion 43 can be disposed on the first metal housing 2 or the second metal housing 4 according to actual design demand. Besides, the locking portion 43 is located inside the accommodating space 20 and protected by the top section 222, the extending section 224 and the bottom section 221, so as to protect the locking portion 43 from deformation or damage by external force. Furthermore, the second metal housing 4 further includes an abutting portion 45 for abutting against the flexible flat transmission component 3 onto the first metal housing 2, so as to fasten the flexible flat transmission component 3. A plurality of grounding clips 46 are also formed on the second metal housing 4.

In contrast to the prior art, the electrical connector of the present invention utilizes the beveled surface disposed on the front end of each contact to reduce the impact of the abutting force of the conducting terminal of the docking connector as docking with the docking connector. It can effectively prevents the contacts of the flexible flat transmission component from being easily peeled and reversely bent, so as to solve a conventional problem that front contacts of a conventional flexible flat cable of a male connector are easily peeled and reversely bent, which results in damage of the conventional flexible flat cable and leads to customer complaints.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. An electrical connector comprising:
    a first metal housing comprising an installation portion;
    a flexible flat transmission component disposed on the installation portion of the first metal housing, the flexible flat transmission component comprising a plurality of contacts, a first inclined surface being formed on a front end of each contact and opposite to the installation portion;
    a second metal housing assembled with the first metal housing and covering the flexible flat transmission component, the plurality of contacts of the flexible flat transmission component exposing out of the second metal housing; and
    at least one locking portion disposed on the first metal housing or the second metal housing, the second metal housing comprising an abutting portion for abutting against the flexible flat transmission component onto the first metal housing, so as to clamp the flexible flat transmission component between the first metal housing and the second metal housing.

2. The electrical connector of claim 1, wherein the flexible flat transmission component is a flexible flat cable comprising a lower insulating layer, a plurality of metal conducting wires arranged in parallel and an upper insulating layer, the lower insulating layer comprising a top surface, a bottom surface opposite to the top surface and a front end surface connected to the top surface and the bottom surface, the plurality of metal conducting wires being disposed on the top surface of the lower insulating layer, the upper insulating layer partially covering the plurality of metal conducting wires, and front ends of the plurality of metal conducting wires stretching out of the upper insulating layer to form the plurality of contacts.

3. The electrical connector of claim 2, wherein the front end surface comprises a second inclined surface, and the second inclined surface and the first inclined surface cooperatively form a beveled surface opposite to the installation portion.

4. The electrical connector of claim 3, further comprising:
    a reinforced plate, a side of the reinforced plate being disposed on the bottom surface of the lower insulating layer, the plurality of contacts and the reinforced plate being disposed on a top side and a bottom side of the lower insulating layer respectively, the reinforced plate comprising a board end surface comprising a third inclined surface, and the third inclined surface, the second inclined surface and the first inclined surface cooperatively forming the beveled surface opposite to the installation portion.

5. The electrical connector of claim 4, wherein an area of the third inclined surface is less than the area of the second inclined surface.

6. The electrical connector of claim 3, wherein an area of the first inclined surface is less than an area of the second inclined surface.

7. The electrical connector of claim 1, wherein the first metal housing comprises at least one first engaging portion, and the second metal housing comprises at least one second engaging portion for engaging with the at least one first engaging portion, and the electrical connector further comprising:
    at least one releasing portion disposed on the first metal housing; and
    at least one locking portion disposed on the second metal housing.

8. The electrical connector of claim 1, wherein a folding portion is disposed on the installation portion, and the plurality of contacts of the flexible flat transmission component are positioned on the folding portion.

9. An electrical connector comprising:
    a first metal housing comprising an installation portion and at least one first engaging portion;
    a flexible flat transmission component disposed on the installation portion of the first metal housing, the flexible flat transmission component comprising a plurality of contacts, a first inclined surface being formed on a front end of each contact and opposite to the installation portion;

a second metal housing assembled with the first metal housing and covering the flexible flat transmission component, the plurality of contacts of the flexible flat transmission component exposing out of the second metal housing, and the second metal housing comprising at least one second engaging portion for engaging with the at least one first engaging portion;

at least one releasing portion disposed on the first metal housing; and at least one locking portion disposed on the second metal housing.

10. The electrical connector of claim 9, wherein the flexible flat transmission component is a flexible flat cable comprising a lower insulating layer, a plurality of metal conducting wires arranged in parallel and an upper insulating layer, the lower insulating layer comprising a top surface, a bottom surface opposite to the top surface and a front end surface connected to the top surface and the bottom surface, the plurality of metal conducting wires being disposed on the top surface of the lower insulating layer, the upper insulating layer partially covering the plurality of metal conducting wires, and front ends of the plurality of metal conducting wires stretching out of the upper insulating layer to form the plurality of contacts.

11. The electrical connector of claim 10, wherein the front end surface comprises a second inclined surface, and the second inclined surface and the first inclined surface cooperatively form a beveled surface opposite to the installation portion.

12. The electrical connector of claim 11, further comprising:

a reinforced plate, a side of the reinforced plate being disposed on the bottom surface of the lower insulating layer, the plurality of contacts and the reinforced plate being disposed on a top side and a bottom side of the lower insulating layer respectively, the reinforced plate comprising a board end surface comprising a third inclined surface, and the third inclined surface, the second inclined surface and the first inclined surface cooperatively forming the beveled surface opposite to the installation portion.

13. The electrical connector of claim 12, wherein an area of the third inclined surface is less than the area of the second inclined surface.

14. The electrical connector of claim 11, wherein an area of the first inclined surface is less than an area of the second inclined surface.

15. The electrical connector of claim 9, wherein a folding portion is disposed on the installation portion, and the plurality of contacts of the flexible flat transmission component are positioned on the folding portion.

16. An electrical connector comprising:

a first metal housing comprising an installation portion, a folding portion being disposed on the installation portion; and a flexible flat transmission component disposed on the installation portion of the first metal housing, the flexible flat transmission component comprising a plurality of contacts positioned on the folding portion, a first inclined surface being formed on a front end of each contact and opposite to the installation portion.

17. The electrical connector of claim 16, further comprising:

a second metal housing assembled with the first metal housing and covering the flexible flat transmission component, the plurality of contacts of the flexible flat transmission component exposing out of the second metal housing.

18. The electrical connector of claim 16, wherein the flexible flat transmission component is a flexible flat cable comprising a lower insulating layer, a plurality of metal conducting wires arranged in parallel and an upper insulating layer, the lower insulating layer comprising a top surface, a bottom surface opposite to the top surface and a front end surface connected to the top surface and the bottom surface, the plurality of metal conducting wires being disposed on the top surface of the lower insulating layer, the upper insulating layer partially covering the plurality of metal conducting wires, and front ends of the plurality of metal conducting wires stretching out of the upper insulating layer to form the plurality of contacts.

19. The electrical connector of claim 18, wherein the front end surface comprises a second inclined surface, and the second inclined surface and the first inclined surface cooperatively form a beveled surface opposite to the installation portion.

20. The electrical connector of claim 19, further comprising:

a reinforced plate, a side of the reinforced plate being disposed on the bottom surface of the lower insulating layer, the plurality of contacts and the reinforced plate being disposed on a top side and a bottom side of the lower insulating layer respectively, the reinforced plate comprising a board end surface comprising a third inclined surface, and the third inclined surface, the second inclined surface and the first inclined surface cooperatively forming the beveled surface opposite to the installation portion.

21. The electrical connector of claim 20, wherein an area of the third inclined surface is less than the area of the second inclined surface.

22. The electrical connector of claim 19, wherein an area of the first inclined surface is less than an area of the second inclined surface.

* * * * *